US012811573B2

(12) United States Patent
Gross et al.

(10) Patent No.: US 12,811,573 B2
(45) Date of Patent: Nov. 24, 2026

(54) COMPETING PATH RING-OSCILLATOR FOR DIRECT MEASUREMENT OF A LATCH TIMING WINDOW PARAMETERS

(71) Applicant: INTERNATIONAL BUSINESS MACHINES CORPORATION, Armonk, NY (US)

(72) Inventors: Blaine Jeffrey Gross, Essex Junction, VT (US); Richard Andre Wachnik, Mount Kisco, NY (US); Leon Sigal, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 17/988,507

(22) Filed: Nov. 16, 2022

(65) Prior Publication Data

US 2024/0162895 A1 May 16, 2024

(51) Int. Cl.

*H03K 5/01* (2006.01)
*G01R 31/317* (2006.01)
*H03K 3/03* (2006.01)
*H03K 3/037* (2006.01)
*H03K 5/00* (2006.01)

(52) U.S. Cl.

CPC ......... *H03K 5/01* (2013.01); *G01R 31/31727* (2013.01); *H03K 3/0315* (2013.01); *H03K 3/037* (2013.01); *H03K 2005/00078* (2013.01)

(58) Field of Classification Search

CPC ............. H03K 5/01; H03K 2005/0078; H03K 3/0315; H03K 3/037; G01R 31/31727; G01R 31/31725

See application file for complete search history.

(56) References Cited

U.S. PATENT DOCUMENTS 6,640,330 B1 10/2003 Joshi
7,042,296 B2 5/2006 Hui et al.
7,113,048 B2 9/2006 Brown et al.
7,622,908 B2 11/2009 Kwak
7,795,939 B2 9/2010 Chen et al.
7,930,663 B2 4/2011 Wissel
8,164,966 B2 4/2012 Stratz et al.
8,305,847 B2 11/2012 Tseng et al.
8,330,548 B2 12/2012 Wagner
8,553,503 B2 10/2013 Molchanov et al.
8,736,338 B2 5/2014 Cao et al.
9,638,752 B2 5/2017 Kim et al.
10,911,042 B2 2/2021 Fukuoka et al.

(Continued)

*Primary Examiner* — Manuel L Barbee

(74) *Attorney, Agent, or Firm* — Onyx IP Group

(57) ABSTRACT

Direct measurement of a latch timing window includes, for each of a plurality of predetermined delay times: providing a first signal to a data input of a first latch of a ring oscillator circuit via a delay block configured to delay the first signal by the predetermined delay time; providing the first signal to a first logic clock buffer (LCB); generating a clock signal by the first LCB responsive to receiving the first signal; providing the clock signal to a clock input of the first latch; and determining from an output of the ring oscillator circuit that the ring oscillator circuit is in either an oscillating state or a non-oscillating state. At least one timing window parameter for the first latch is determined based on one or more of the plurality of delay times that are associated with an oscillating state of the ring oscillator circuit.

21 Claims, 6 Drawing Sheets

100

(56) References Cited

U.S. PATENT DOCUMENTS

| | | | | |
|---|---|---|---|---|
| 10,951,199 | B1 | 3/2021 | Jung et al. | |
| 2008/0071489 | A1 | 3/2008 | Wissel | |
| 2012/0044024 | A1* | 2/2012 | Wagner | H03K 3/0315 331/57 |
| 2023/0275572 | A1* | 8/2023 | Raja | H03K 5/01 331/57 |
| 2024/0233854 | A1* | 7/2024 | Akiyoshi | G11C 11/412 |

* cited by examiner

300

| Device Name | | Meas Ring Period | TIN Delay/Stage | DeMux'd Results | DeMux'd Results | DeMux'd Results |
|---|---|---|---|---|---|---|
| RoUCT18 | Control (TIN=16) | 534.2 nS | 3.00 pS | | | |
| RoUCT18 | Control (TIN=96) | 774.0 nS | | | | |
| | | | MUX Factor | | | |
| RoUCP06 | TIN= 10,20,30 | 1089 nS | 1 **2** 4 | TIN=10:no osc | **TIN=20: OSC** | TIN=30: no osc |
| RoUCP12 | TIN= 8,18,28 | 1077 nS | 1 **2** 4 | TIN=8:no osc | **TIN=18: OSC** | TIN=28: no osc |
| RoUCP18 | TIN= 6,16,26 | No Oscillation | 1 2 4 | TIN=6:no osc | TIN=16: no osc | TIN=26: no osc |
| RoUCP24 | TIN= 4,14,24 | 2212 nS | 1 2 **4** | TIN=4:no osc | TIN=14: no osc | **TIN=24: OSC** |
| RoUCP30 | TIN= 2,12,22 | 2211 nS | 1 2 **4** | TIN=2:no osc | TIN=12: no osc | **TIN=22:OSC** |

FIG. 3

502
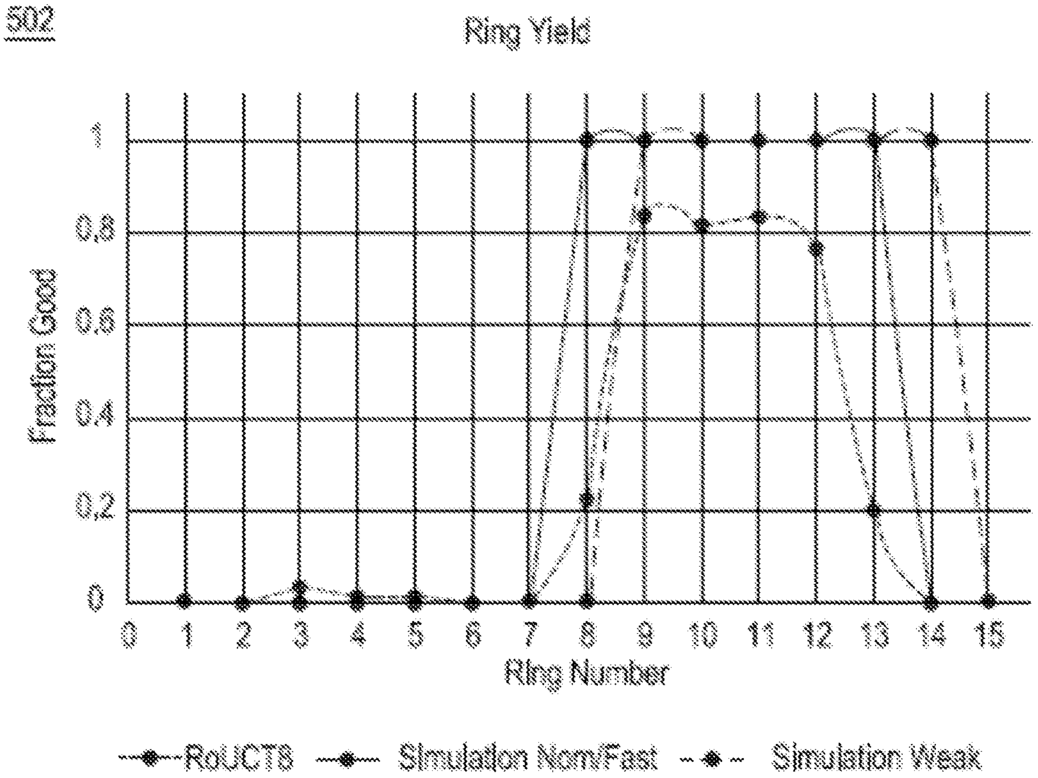
504
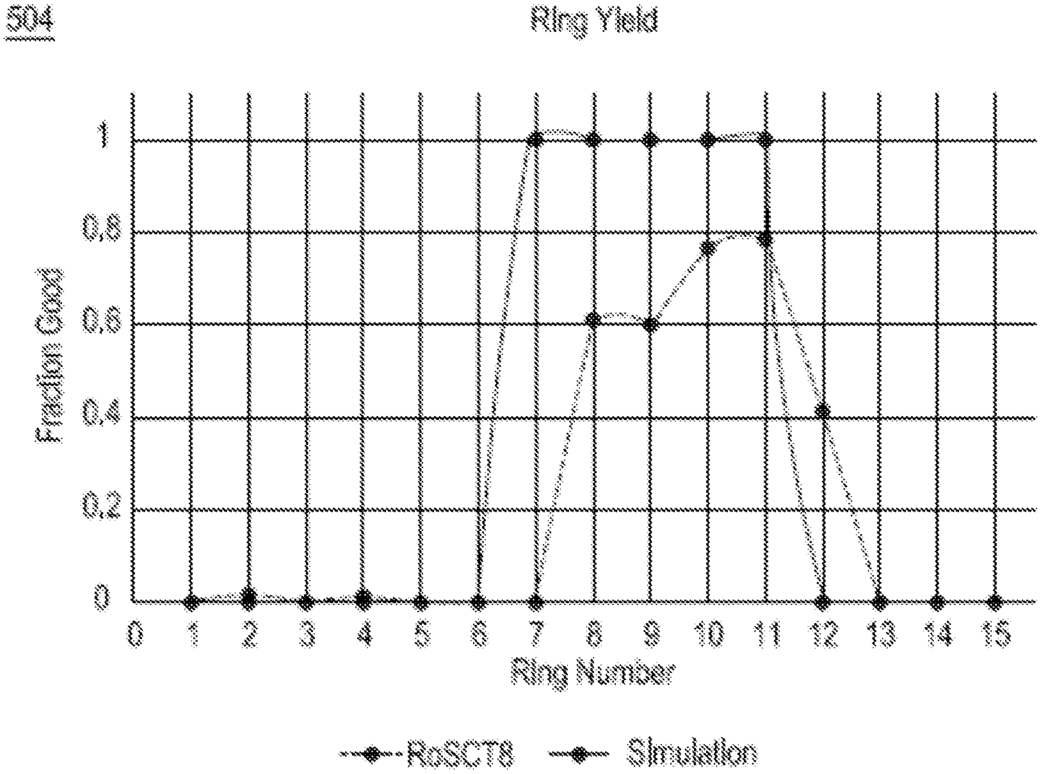
FIG. 5

COMPETING PATH RING-OSCILLATOR FOR DIRECT MEASUREMENT OF A LATCH TIMING WINDOW PARAMETERS

BACKGROUND

Field of the Invention

The field of the invention is data processing, or, more specifically, methods, apparatus, and products for direct measurement of latch timing window parameters.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Processors and other circuits are typically fabricated on integrated circuit (IC) dice. These processors and other circuits typically include a number of latch circuits. The correct operation of latch circuits are critically dependent on the timing of the clock signal relative to the input and output data signals. The amount of time needed for the output of the latch circuit to settle to a new state is called the "setup-time". A change in the input data signal while the latch circuit is settling can cause an incorrect state called an "early-mode failure". The time-margin needed to ensure the latch does not settle to the incorrect state is called the "hold time". Failures from hold times lead to a non-functional IC, and failures from setup-time lead to reduced performance and reduced value ICs. Latch setup-times are relatively straightforward to estimate from hardware measurement by characterizing "data-to-Q" and "clock-to-Q" delays, but latch hold-times are generally not measured in hardware currently. Instead, simulations are generally used to generate estimates of hold-time and setup-time. Additional timing margin is often added as a safety-factor to guard-band the simulation estimates. Differences between simulation predictions and actual performance, as well as the added guard-band margins, reduce performance of the latch circuits. Accordingly, methods and apparatus for improved understanding of latch behavior through direct measurements are desired in order to reduce such performance costs.

SUMMARY

An embodiment of a method for direct measurement of a latch timing window includes, for each of a plurality of predetermined delay times: providing a first signal to a data input of a first latch of a ring oscillator circuit via a delay block, the delay block configured to delay the providing of the first signal to the data input of the first latch by the predetermined delay time; providing the first signal to a first logic clock buffer (LCB); generating a clock signal by the first LCB responsive to receiving the first signal; providing the clock signal to a clock input of the first latch; and determining from an output of the ring oscillator circuit that the ring oscillator circuit is in either an oscillating state or a non-oscillating state. The method further includes determining at least one timing window parameter for the first latch based on one or more of the plurality of delay times that are associated with an oscillating state of the ring oscillator circuit.

In some embodiments, determining that the ring oscillator circuit is in either an oscillating condition or non-oscillating condition is determined using a plurality of ring oscillator circuits each having a delay block configured for the predetermined delay time. In some embodiments, the method further includes combining the outputs of each of the plurality of ring oscillator circuits into a multiplexed output signal, wherein the oscillating state of each of the ring oscillator circuits is determined based on the multiplexed signal.

In some embodiments, the delay block comprises a plurality of inverter delay stages having a total delay equal to the predetermined delay time. In some embodiments, the delay block comprises a variable digital delay stage having a delay configured to be set to the predetermined delay time. In some embodiments, the delay block comprises a variable analog delay circuit having a delay configured to be set to the predetermined delay time. In some embodiments, the delay block comprises a digital tap circuit including digital multiplexing circuitry to tap into a chain of a plurality of delay stages to configure a delay of the delay block to the predetermined delay time.

In some embodiments, the method further includes mapping the oscillating state or non-oscillating state and associated predetermined delay time for each of the predetermined time delays to latch tuning bit values; and tuning a latch timing of a second latch using the latch tuning bit values. In some embodiments, the mapping of the oscillating state or non-oscillating state is performed using a digital state machine or a neural network. In some embodiments, tuning the latch timing of the second latch is performed at predetermined time intervals.

In some embodiments, the first signal comprises a start-up pulse signal. In some embodiments, the at least one timing window parameter includes one or more of a setup time or a hold time of the first latch.

An embodiment of an apparatus for direct measurement of a latch timing window includes a ring oscillator circuit comprising: a first latch including a data input, a clock input, and a latch output; a delay block coupled to the data input of the latch, the delay block configured to receive a first signal and delay providing of the first signal to the data input of the first latch by a predetermined delay time; and a first logic clock buffer (LCB) coupled to the clock input of the first latch, the first LCB configured to receive the first signal, generate a clock signal responsive to receiving the first signal, and provide the clock signal to the clock input of the first latch. The apparatus further includes a measurement circuit configured to determine from an output of the ring oscillator circuit that the ring oscillator circuit is in either an oscillating state or a non-oscillating state.

In an embodiment, the measurement circuit is further configured to operate the ring oscillator circuit for each of a plurality of predetermine delay times to determine that the ring oscillator is in either the oscillating state or the non-oscillating state for the predetermined delay time, and determine at least one timing window parameter for the first latch based on one or more of the plurality of predetermined delay times that are associated with an oscillating state of the ring oscillator circuit. In some embodiments, the at least one timing window parameter includes one or more of a setup time or a hold time of the first latch.

In some embodiments, the delay block comprises a plurality of inverter delay stages having a total delay equal to the predetermined delay time. In some embodiments, the delay block comprises a variable digital delay stage having a delay configured to be set to the predetermined delay time. In some embodiments, the delay block comprises a variable analog delay circuit having a delay configured to be set to the predetermined delay time. In some embodiments, the delay block comprises a digital tap circuit including digital multiplexing circuitry to tap into a chain of a plurality of delay stages to configure a delay of the delay block to the predetermined delay time.

In some embodiments, the first signal comprises a start-up pulse signal.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 3 illustrates a table of exemplary test results of operation of the competing path ring oscillator circuits of FIG. 2 according to embodiments of the present invention.

FIG. 5 illustrate a comparison of direct measurement results to simulation results according to embodiments of the present invention.

DETAILED DESCRIPTION

Embodiments in accordance with the present disclosure provide for an apparatus, methods, and products for direct measurement of latch timing window parameters using a competing path ring oscillator. Various embodiments provide for a circuit structure and measurement method for direct measurement in hardware, during or after fabrication, of critical timing window parameters of a latch such as hold-time and set-up time. In various embodiments, multiple competing path ring oscillators are implemented on an IC die (or wafer) as testing circuits along with other IC circuitry (e.g., processor circuitry) configured to perform the desired functions of the IC die. A single start-up pulse is launched around the ring oscillator and propagates to a data input of a latch through a delay-block having a delay $T_{IN}$. The start-up pulse also propagates to a logic-clock-buffer (LCB) which generates a clock pulse in response to receiving the start-up pulse, and provides the clock pulse to the clock input of the latch. If the delayed start-up pulse arrives at the data input of the latch before the clock-pulse from the LCB arrives at the latch, no oscillation of the ring oscillator will occur. Likewise, if the delayed start-up pulse arrives at the data input of the latch too late after the clock pulse from the LCB activates the latch, no oscillation of the latch will occur. Only if the start-up pulse arrives at the data input of the latch during a brief time window that the clock pulse triggers the latch, will oscillations of the ring oscillator persist. In accordance with various embodiments, multiple competing path ring oscillators are implemented which are substantially identical except that the delay-block for each ring oscillator is configured with a different delay $T_{IN}$. Only those ring oscillators having a delay $T_{IN}$ within a certain range of values will cause the ring oscillator to oscillate. By determining the range of $T_{IN}$ delays that produce ring oscillators that will oscillate, a direct measurement of time window parameters of the latch, such as hold time and setup time, are produced. Because other latch circuits on the same IC die are expected to exhibit substantially the same behavior as the latches associated with the ring oscillators of the testing circuit, the time window parameters of the other latch circuits are assumed to be substantially the same as the latches test circuits. One or more embodiments provide for circuit structures and methods for the direct measurement of timing window parameters of a latch in a self-calibrated fashion suitable for inline test of mass-produced circuits.

Figure 1:
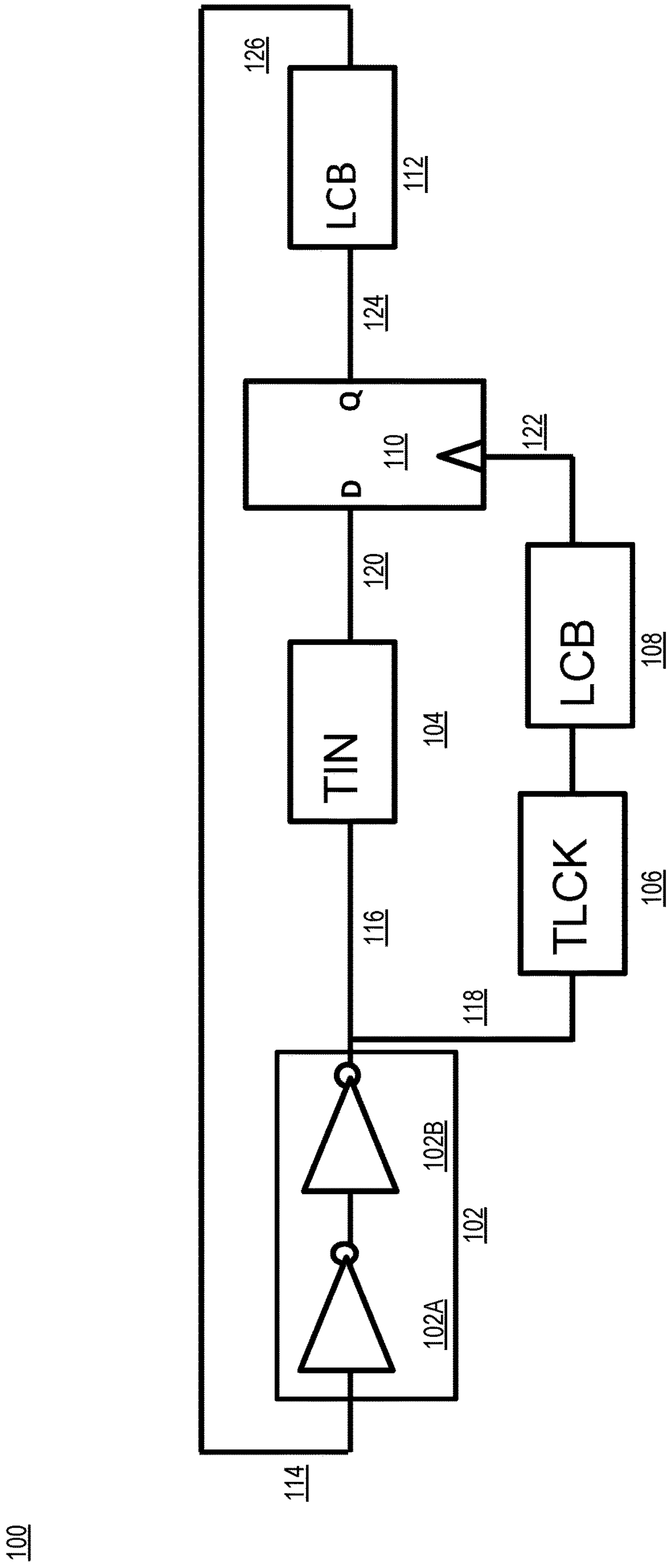
FIG. 1 illustrates a block diagram of a competing path ring oscillator circuit for direct measurement of latch timing window parameters according to embodiments of the present invention.

Exemplary methods, apparatus, and products for direct measurement of latch timing window parameters in accordance with the present invention are described with reference to the accompanying drawings, beginning with FIG. 1. FIG. 1 sets forth a block diagram of a competing path ring-oscillator circuit 100 for direct measurement of latch timing window parameters according to embodiments of the present invention. The competing path ring oscillator of FIG. 1 includes a logic delay block 102 having a first logic delay stage 102A (e.g., an inverter), a second logic delay stage 102B (e.g., an inverter), a delay block 104 having a delay $T_{IN}$, a delay block 106 having delay $T_{LCK}$, a first LCB 108, a latch 110, and a second LCB 112. An output of the LCB 112 is coupled to an input of the first logic delay stage 102A, and an output of the first logic delay stage 102A is coupled to an input of the second logic delay stage 102B. Although the embodiment illustrated in FIG. 1 shows the logic delay block 102 as including the first logic delay stage 102A and the second logic delay stage 102B, in other embodiments the logic delay block 102 includes any even number of logic delay stages. An output of the second logic delay stage 102B is coupled to both an input of the delay block 104, and an input of the delay block 106. An output of the delay block 104 is coupled to a data input of the latch 110. An output of the delay block 106 is coupled to an input of the first LCB 108, and an output of the first LCB 108 is coupled to a clock input of the latch 110. An output of the latch 110 is coupled to an input of the second LCB 112. As previously described above, the output of the LCB 112 is coupled to the input of the first logic delay stage 102A to complete the ring. Although various embodiments are illustrated showing latch 110 as a D-latch, it should be understood that in other embodiments any other suitable latching circuit is used.

During an exemplary operation of the competing path ring-oscillator circuit 100 of FIG. 1 for a device-under-test (DUT), a start-up circuit initiates a single start-up pulse 114 at the output of the second LCB 112 and provides the start-up pulse 114 to a delay feedback path formed of the first logic delay stage 102A and the second logic delay stage 102B. The output of the second logic delay stage 102B is split at a common split point into a data path 116 provided to the input of the delay block 104 and a clock path 118 provided to the input of the delay block 106. The clock path 118 flows into the first LCB which provides a clock signal 122 to drive the clock input of the latch 110. The data path 116 flows through the delay block 104 which delays the signal by a time delay of $T_{IN}$ to produce a delayed signal 120. The delayed signal 120 is provided to the data input of the latch 110. If the data signal and clock signal are provided to the latch 110 within a certain time window, the latch 110 generates an output signal 124 into the second LCB 112. The LCB 112 regenerates the signal into a uniform pulse 126 and the competing path ring oscillator continues oscillate in a ring-oscillator fashion. If the data signal and clock signal are not provided to the latch 110 within the certain time window, no output signal is generated by the second LCB 112 and the competing path ring oscillator will not oscillate.

Figure 2:
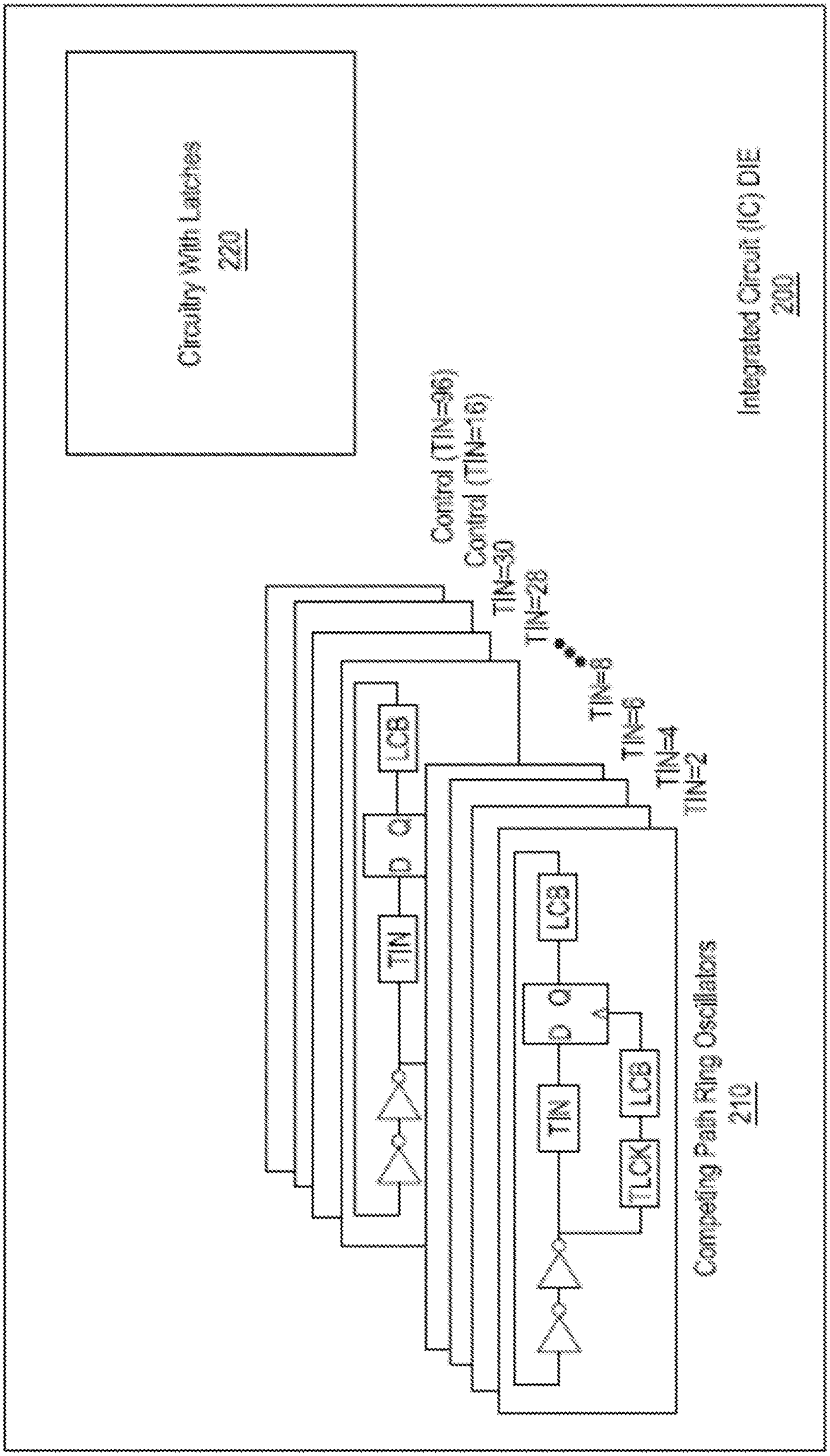
FIG. 2 illustrates an integrated circuit die having multiple competing path ring oscillator circuits for measurement of latch timing window parameters according to embodiments of the present invention.

FIG. 2 illustrates an integrated circuit (IC) die 200 having multiple competing path ring oscillator circuits 210 for measurement of latch timing window parameters according to embodiments of the present invention. The IC die 200 further includes other circuitry with latches 220 (e.g., a processor) that perform the desired function of the IC die 200. In accordance with various embodiments, the competing path ring oscillator circuits 210 include multiple of the competing path ring oscillator circuits 100 of FIG. 1 that are implemented with varying delays $T_{IN}$ configured within the delay block 104 but with the remaining circuitry being substantially the same. In particular embodiments, the competing path ring oscillator circuits 210 are all implemented in close proximity on the same wafer so that they can all be assumed to perform identically other than the deliberate variation built-into the $T_{IN}$ delays. In particular embodiments, random variations of performance due to quantized charge are known and minimized through averaging if necessary. In the particular embodiment illustrated in FIG. 2, the competing path ring oscillator circuits 210 include two control ring oscillators and five test ring oscillators. The control ring oscillators have $T_{IN}$=96 and $T_{IN}$=16, and the test ring oscillators have a range of $T_{IN}$ of $T_{IN}$=2, 4, 6, 8, . . . , 28, and 30.

During exemplary operation of each of the competing path ring oscillator circuits 100, the competing path ring oscillator circuits 100 with the shortest $T_{IN}$ delays will likely not oscillate. The competing path ring oscillator circuits 100 with slightly longer $T_{IN}$ delays that do oscillate provide a direct measurement of the hold time for the latch 110. The competing path ring oscillator circuits 100 with $T_{IN}$ delays that are slightly longer will also likely oscillate. The competing path ring oscillator circuits 100 with $T_{IN}$ delays that are somewhat longer will likely not oscillate. The competing path ring oscillator circuits 100 over the range of $T_{IN}$ delays which oscillate provide a direct hardware measurement of time window parameters such as hold time and set up time for the latch 110. The control ring-oscillators are configured with the clock-input enabled, so that the circuit will always oscillate. The difference of the ring-oscillator period of oscillation of the two control-rings (one with a 16-inverter-delay/TIN=16 and the other one with 96-inverter delay/TIN=96, is used to calculate the average delay of the inverters used in the circuit.

In one or more embodiments, the outputs of groups of competing path ring oscillators are frequency-division-multiplexed onto a single output in order to implement more variations of $T_{IN}$ into a smaller space as further described herein. By measuring each of the different competing path ring oscillators in a single pass, the results demonstrate which competing path ring oscillators produce a sustaining oscillator, and which do not. The competing path ring oscillators which sustain operation demonstrate the hold-time and the setup-time of the latch DUT.

In particular embodiments, multiplexing circuitry in which the outputs of competing path ring oscillators with widely separated values of $T_{IN}$ are frequency-division-multiplexed onto a single output signal. In this way, competing-path ring-oscillators with, for example, three separate values of TIN can be measured simultaneously, thereby greatly reducing test time. In other embodiments, the $T_{IN}$ delay values are varied either individually or as a group to increase the range of setup/hold-time values which can be characterized, to dither the $T_{IN}$ delays or to scale the $T_{IN}$ delays to increase resolution.

In an embodiment, the delay block 104 is implemented using a varying number of identical inverter delay stages. In this way, the delay of a single delay stage defines the resolution of the timing data that can be extracted. In another embodiment, the delay block 104 is implemented using a digital delay in which $T_{IN}$ delay is configured using a variable-delay stage where input bits are used to switch additional delay elements into the signal path, so that a single ring oscillator can be tuned to determine the hold-time and setup-time of the latch 110. This reduces uncertainties from mismatching of adjacent ring-oscillators. In another embodiment, the delay block 104 is implemented as using an analog delay in which $T_{IN}$ delay is configured using a variable-delay using an analog modulation input to vary, e.g., a tail-current or capacitor, to smoothly vary the $T_{IN}$ delay over a range of values. In another embodiment, the delay block 104 is implemented as using a digital tap in which the effective $T_{IN}$ delay is varied using digital-multiplexing circuitry to tap-into a chain of delay stages at any point in the chain, and the tap-point is fed to the LCB side of the circuit. This approach has the advantages of the above implementations, as well as the advantage that the ring oscillator frequency will be the same for each of the tap-points.

In an embodiment, the set of oscillating and non-oscillating competing path ring oscillators are mapped to poke bit values using to adjust the latch timing of one or more latches on the IC die. In particular embodiments, the mapping is performed using a digital state machine or a neural network. In one or more embodiments, the mapping is applied to the latch at predetermined time intervals such as first power-on and at subsequent moments during the life of the integrated circuit to account for circuit aging.

FIG. 3 illustrates a table 300 of exemplary test results of operation of the competing path ring oscillator circuits 210 of FIG. 2. The table 300 shows a device name of each competing path ring oscillator, corresponding $T_{IN}$ values, a measured ring period, a $T_{IN}$ delay/stage multiplex (MUX) factor, and demultiplexed results of the fifteen frequency-divisional multiplexed (FDM) operations of the competing path ring oscillator circuits 210 of FIG. 2. Device RoUCT18 and Device RoUXT18 are control competing path ring oscillator circuits having $T_{IN}$=16 and $T_{IN}$=96, respectively. The measured ring periods of Device RoUCT18 and Device RoUXT18 are 534.2 nS and 774.0 nS respectively, from which the average inverter-delay ($T_{IN}$-delay per stage) can be calculated to be 3.00 pS for this particular lot, wafer, site, bias, and temperature. Device RoUCP06 has $T_{IN}$ delays=10, 20, and 30, and a measured ring period of 1089 nS; Device RoUCP12 has $T_{IN}$ delays=8, 18, and 28, and a measured ring period of 1077 nS; Device RoUCP18 has $T_{IN}$ delays=6, 16, and 26, and is determined to have no oscillation; Device RoUCP 24 $T_{IN}$ delays=4, 14, and 24, and a measured ring period of 2212 nS; and RoUCP30 has $T_{IN}$ delays=2, 12, and 22, and a measured ring period of 2211 nS.

For Device RoUCP06, the measured ring period is approximately twice the measured ring period of Control Device RoUCT18 indicating a MUX factor of 2 being associated with the oscillation of Device RoUCP06. Accordingly, the demuxed results for Device RoUCP06 indicate that the oscillation occurred with a $T_{IN}$=20. For Device RoUCP12, the measured ring period is approximately twice the measured ring period of Control Device RoUCT18 indicating a MUX factor of 2 being associated with the oscillation of Device RoUCP12. Accordingly, the demuxed results for Device RoUCP12 indicate that the oscillation occurred with a $T_{IN}$=18. For Device RoUCP24, the measured ring period is approximately four times the measured ring period of Control Device RoUCT18 indicating a MUX factor of 4 being associated with the oscillation of Device RoUCP24. Accordingly, the demuxed results for Device RoUCP24 indicate that the oscillation occurred with a $T_{IN}$=24. For Device RoUCP30, the measured ring period is approximately four times the measured ring period of Control Device RoUCT18 indicating a MUX factor of 4 being associated with the oscillation of Device RoUCP30. Accordingly, the demuxed results for Device RoUCP30 indicate that the oscillation occurred with a $T_{IN}$=22.

The results indicate that oscillation occurred with delay block $T_{IN}$ values=18, 20, 22, and 24. $T_{IN}$ values less than or equal to 16 inverter delays results in the ring data pulse arriving at the latch of the competing path ring oscillator too early to maintain oscillation. $T_{IN}$ values greater than or equal to 26 inverter delays results in the ring data pulse arriving at the latch of the competing path ring oscillator too late to maintain oscillation. The range of $T_{IN}$ delays over which the competing path ring oscillators maintain oscillation provide a direct measurement of the timing window parameters for the latch including latch hold time and latch setup time. In the example of FIG. 3, the setup and hold times for the latch are shifted by approximately 6 pS from the simulated value.

Figure 4:
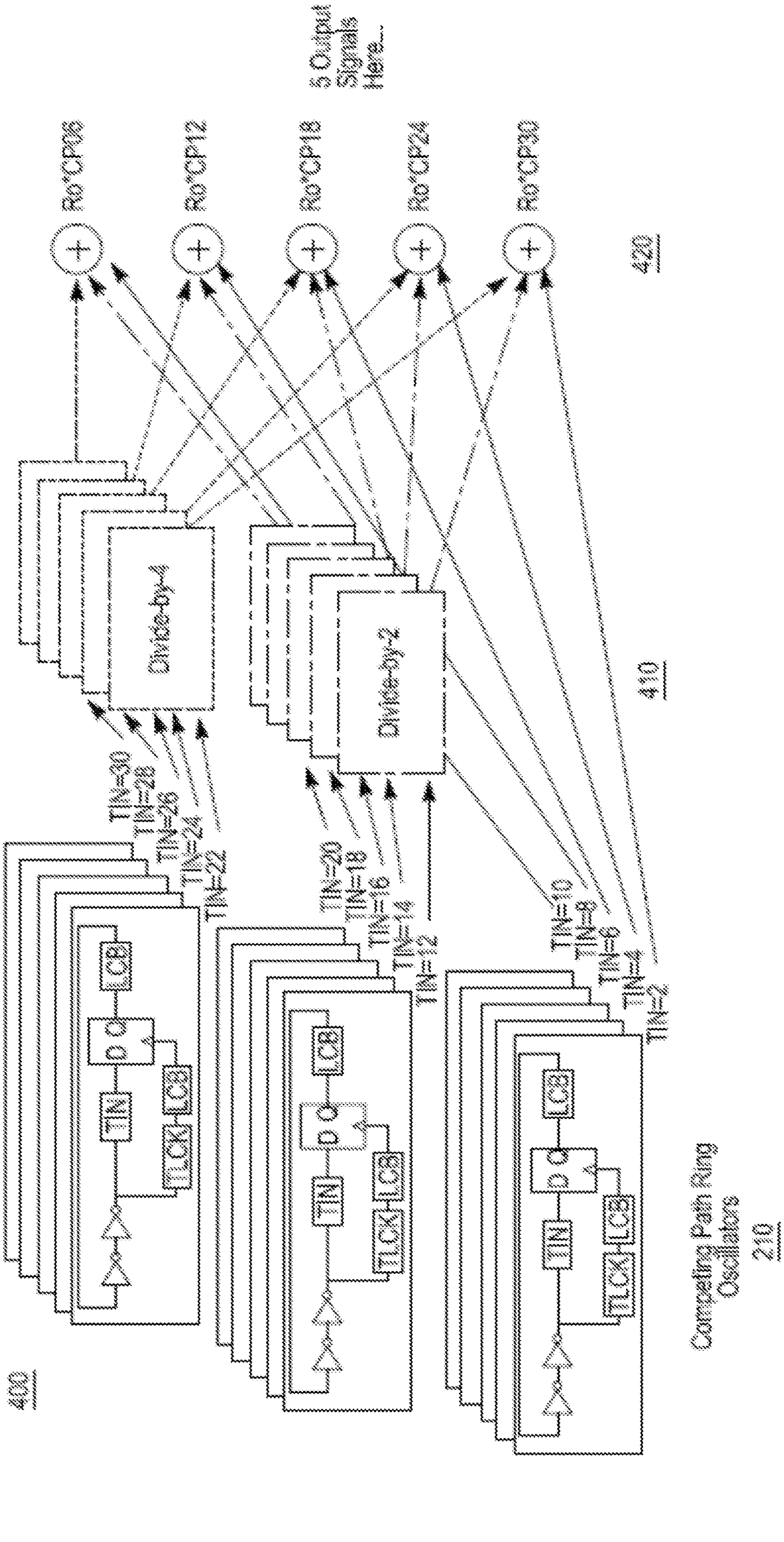
FIG. 4 illustrates an exemplary frequency-division multiplexing operation 400 of the competing path ring oscillator circuits 210 of FIG. 2 according to embodiments of the present invention.

FIG. 4 illustrates an exemplary frequency-division multiplexing operation 400 of the competing path ring oscillator circuits 210 of FIG. 2 according to embodiments of the present invention. In the example of FIG. 4, fifteen competing path ring oscillator circuits 210 are grouped into five groupings of three rings each. The three rings of each grouping are each frequency-division multiplex (FDM) combined using a divide operation 410 followed by an exclusive-OR mixing operation 420 to form a single output. During the frequency-shifting operation 410, the ring outputs for the competing path ring oscillators having $T_{IN}$=22, 24, 26, 28, and 30 are divided by four. The ring outputs for the competing path ring oscillators having $T_{IN}$=12, 14, 16, 18, and 20 are divided by two. The ring outputs for the competing path ring oscillators having $T_{IN}$=2, 4, 6, 8, and 10 are undivided. The multiplexed ring outputs for the competing path ring oscillators having $T_{IN}$=2, 12, and 22 are FDM-combined to a single output line R0*CP30. The multiplexed ring outputs for the competing path ring oscillators having $T_{IN}$=4, 14, and 24 are FDM-combined to a single output line R0*CP24. The multiplexed ring outputs for the competing path ring oscillators having $T_{IN}$=6, 16, and 26 are FDM-combined to a single output line R0*CP18. The multiplexed ring outputs for the competing path ring oscillators having $T_{IN}$=8, 18, and 28 are FDM-combined to a single output line R0*CP12. The multiplexed ring outputs for the competing path ring oscillators having $T_{IN}$=10, 20, and 30 are FDM-combined to a single output line R0*CP06. Since the individual ring oscillator outputs of each of the five output signals are separated in frequency by the frequency-division multiplexing, the oscillation state for each of the competing path ring oscillator circuits 210 may be determined. Based on the oscillating states and associated $T_{IN}$ delays of the competing path ringer oscillators, the timing window parameters for the latch is determined.

FIG. 5 illustrate a comparison of direct measurement results to simulation results according to embodiments of the present invention. Graph 502 and graph 504 shows measurement results from two measurements labeled “RoUCT8” and “RoSCT8”, respectively, for results with ring-oscillators each with fifteen variations of $T_{IN}$ when compared to simulation results of a nominal wafer, a wafer with fast performance, and a wafer with weak performance. The x-axis indicates the ring number of each of the fifteen competing path ring oscillators, and the y-axis indicates the ring yield fraction indicating the fraction of competing path ring oscillators indicated as “good”. The graph 504 and graph 504 enable characterization of the latches for direct comparison to product hardware including the latches. The extracted data measurements demonstrate that the range of actual hold and setup times as determined by direct measurement is narrower than and shifted when compared to results predicted by simulation. The calibration using the measurements of the control ring-oscillators allow calculation of the $T_{IN}$ delays, which are then used to convert from a “Ring Number” to time-delay in seconds.

Figure 6:
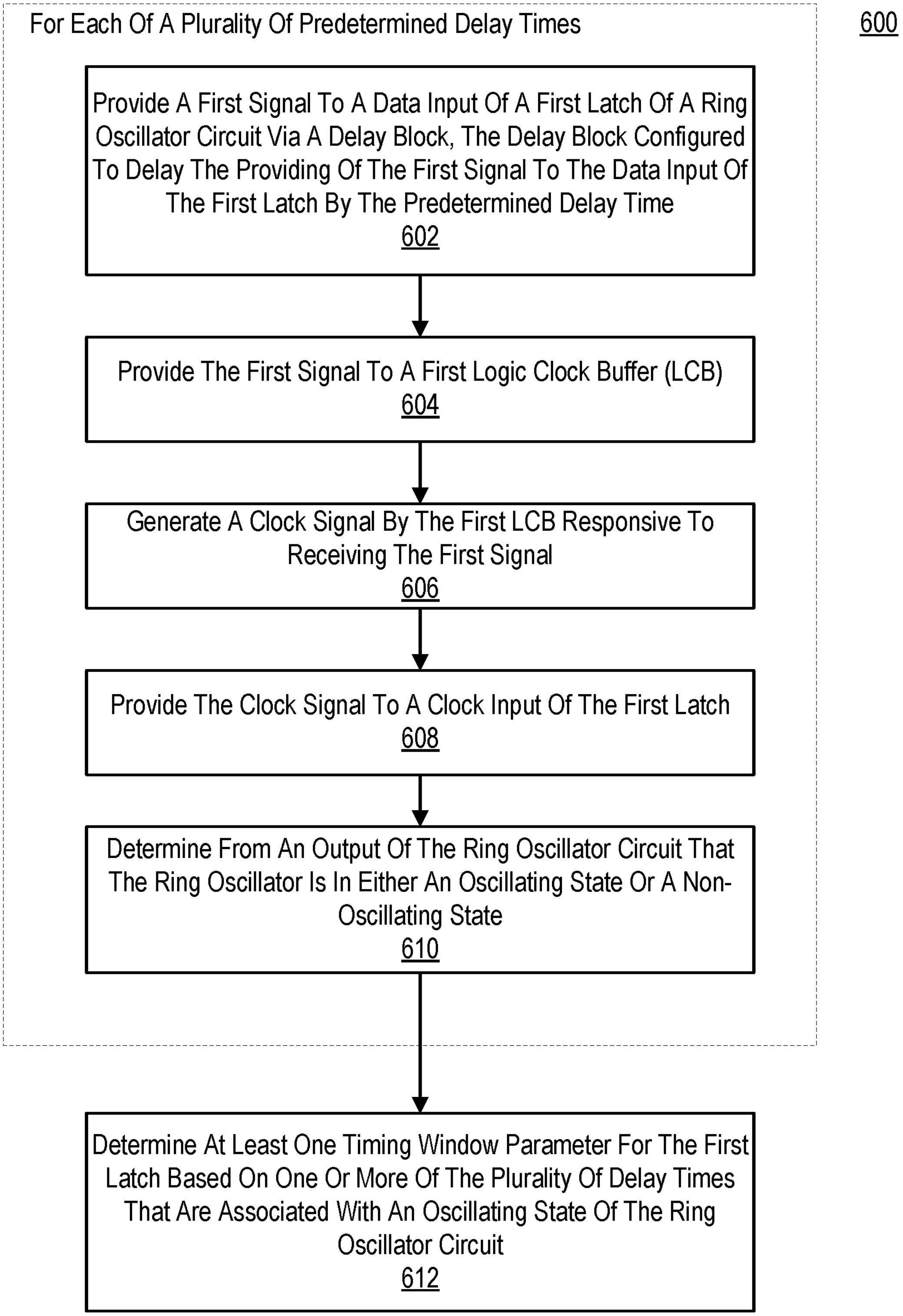
FIG. 6 sets forth a flow chart illustrating an exemplary method for direct measurement of latch timing window parameters according to embodiments of the present invention.

For further explanation, FIG. 6 sets forth a flow chart illustrating an exemplary method 600 for direct measurement of latch timing window parameters according to embodiments of the present invention. The method 600 includes, for each of a plurality of predetermined delay times, providing (602) a first signal to both a data input of a first latch of a ring oscillator circuit via a delay block, and the clock input of the same latch via a logic clock buffer. The delay block is configured to delay providing of the first signal to the data input of the latch by the predetermined delay time. In particular embodiments, the ring oscillator circuit includes the competing path ring oscillator described herein with respect to various embodiments. In a particular embodiment, the first signal is a start-up pulse signal.

In an embodiment, the delay block includes a plurality of inverter delay stages having a total delay equal to the predetermined delay time. In an embodiment, the delay block includes a variable digital delay stage having a delay configured to be set to the predetermined delay time. In another embodiment, the delay block includes a variable analog delay circuit having a delay configured to be set to the predetermined delay time. In another embodiment, the delay block includes a digital tap circuit including digital multiplexing circuitry to tap into a chain of a plurality of delay stages to configure a delay of the delay block to the predetermined delay time.

The method 600 further includes, for each of a plurality of predetermined delay times, providing (604) the first signal to a first logic clock buffer (LCB), generating (606) a clock signal by the first LCB responsive to receiving the first signal, and providing (608) the clock signal to a clock input of the first latch. The method 600 further includes, for each of a plurality of predetermined delay times, determining (610) from an output of the ring oscillator circuit that the ring oscillator circuit is in either an oscillating state or a non-oscillating state.

In an embodiment, determining that the ring oscillator circuit is in either an oscillating condition or non-oscillating condition is determined using a plurality of ring oscillator circuits each having a delay block configured for the particular predetermined delay time. In an embodiment, the outputs of each of the plurality of ring oscillator circuits are combined into a multiplexed output signal, and the oscillating state of each of the ring oscillator circuits is determined based on the multiplexed signal.

The method 600 further includes determining (612) at least one timing window parameter for the first latch based on one or more of the plurality of delay times that are associated with an oscillating state of the ring oscillator circuit. In particular embodiments, the at least one timing window parameter includes one or more of a setup time or a hold time of the latch.

In an embodiment, the oscillating state or non-oscillating state and associated predetermined delay time for each of the predetermined time delays are mapped to latch tuning bit values (e.g., poke bit values), and the latch timing of a second latch is tuned using the latch tuning bit values. In particular embodiments, the mapping of the oscillating state or non-oscillating state is performed using a digital state machine or a neural network. In a particular embodiment utilizing a neural network the oscillating state or non-oscillating state and associated predetermined time delays are used as a feature set for training the neural network, and the output of the neural network are the latch tuning bit values. In a particular embodiment, tuning the latch timing of the second latch is performed at predetermined time intervals such as at start-up or specific times during the life of the circuit to compensate for changes in the circuit over time.

In view of the explanations set forth above, readers will recognize that the benefits of direct measurement of latch timing window parameters according to embodiments of the present invention include:

- Direct measurement of latch timing window parameters provides for a more accurate determination of latch performance.
- Direct measurement of latch timing window parameters allow for more minimization of costs associated with added guard-band margins and performance costs due to inaccurate characterization of latch performance.
- Direct measurement of latch hold-time early in the wafer processing allows proactive changes in the fabrication process.
- Direct measurement of latch timing window parameters allows feedback to justify guard-band decisions to improve timing margins.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for direct measurement of a latch timing window, the method comprising:

for each of a plurality of predetermined delay times:

providing a first signal to a data input of a first latch of a ring oscillator circuit via a delay block coupled to a common split point of the ring oscillator circuit, the delay block configured to delay the providing of the first signal to the data input of the first latch by the predetermined delay time;

providing the first signal to a first logic clock buffer (LCB) coupled to the common split point;

generating a clock signal by the first LCB responsive to receiving the first signal;

providing the clock signal to a clock input of the first latch;

determining from an output of the ring oscillator circuit that the ring oscillator circuit is in either an oscillating state or a non-oscillating state; and determining at least one timing window parameter for the first latch based on one or more of the plurality of delay times that are associated with an oscillating state of the ring oscillator circuit.

2. The method of claim 1, wherein the determining that the ring oscillator circuit is in either an oscillating condition or non-oscillating condition is determined using a plurality of ring oscillator circuits each having a delay block configured for the predetermined delay time.

3. The method of claim 2, further comprising:

combining the outputs of each of the plurality of ring oscillator circuits into a multiplexed output signal, wherein the oscillating state of each of the ring oscillator circuits is determined based on the multiplexed output signal.

4. The method of claim 1, wherein the delay block comprises a plurality of inverter delay stages having a total delay equal to the predetermined delay time.

5. The method of claim 1, wherein the delay block comprises a variable digital delay stage having a delay configured to be set to the predetermined delay time.

6. The method of claim 1, wherein the delay block comprises a variable analog delay circuit having a delay configured to be set to the predetermined delay time.

7. The method of claim 1, wherein the delay block comprises a digital tap circuit including digital multiplexing circuitry to tap into a chain of a plurality of delay stages to configure a delay of the delay block to the predetermined delay time.

8. The method of claim 1, further comprising:

mapping the oscillating state or non-oscillating state and associated predetermined delay time for each of the predetermined time delays to latch tuning bit values; and tuning a latch timing of a second latch using the latch tuning bit values.

9. The method of claim 8, wherein the mapping of the oscillating state or non-oscillating state is performed using a digital state machine or a neural network.

10. The method of claim 8, wherein tuning the latch timing of the second latch is performed at predetermined time intervals.

11. The method of claim 1, wherein the first signal comprises a start-up pulse signal.

12. The method of claim 1, wherein the at least one timing window parameter includes one or more of a setup time or a hold time of the first latch.

13. The method of claim 1, wherein determining the at least one timing window parameter comprises identifying a setup time and a hold time of the first latch based on a boundary between delay times of the plurality of predetermined delay times that are associated with the oscillating state of the ring oscillator circuit and delay times of the plurality of predetermined delay times that are associated with the non-oscillating state of the ring oscillator circuit.

14. An apparatus for direct measurement of a latch timing window, the apparatus comprising:

a ring oscillator circuit comprising:

a first latch including a data input, a clock input, and a latch output;

a delay block coupled to a common split point of the ring oscillator circuit and the data input of the first latch, the delay block configured to receive a first signal and delay providing of the first signal to the data input of the first latch by a predetermined delay time; and a first logic clock buffer (LCB) coupled to the common split point and the clock input of the first latch, the first LCB configured to receive the first signal, generate a clock signal responsive to receiving the first signal, and provide the clock signal to the clock input of the first latch; and a measurement circuit configured to determine from an output of the ring oscillator circuit that the ring oscillator circuit is in either an oscillating state or a non-oscillating state.

15. The apparatus of claim 14, wherein the measurement circuit is further configured to operate the ring oscillator circuit for each of a plurality of predetermined delay times to determine that the ring oscillator is in either the oscillating state or the non-oscillating state for the predetermined delay time, and determine at least one timing window parameter for the first latch based on one or more of the plurality of predetermined delay times that are associated with an oscillating state of the ring oscillator circuit.

16. The apparatus of claim 15, wherein the at least one timing window parameter includes one or more of a setup time or a hold time of the first latch.

17. The apparatus of claim 14, wherein the delay block comprises a plurality of inverter delay stages having a total delay equal to the predetermined delay time.

18. The apparatus of claim 14, wherein the delay block comprises a variable digital delay stage having a delay configured to be set to the predetermined delay time.

19. The apparatus of claim 14, wherein the delay block comprises a variable analog delay circuit having a delay configured to be set to the predetermined delay time.

20. The apparatus of claim 14, wherein the delay block comprises a digital tap circuit including digital multiplexing circuitry to tap into a chain of a plurality of delay stages to configure a delay of the delay block to the predetermined delay time.

21. The apparatus of claim 14, wherein the first signal comprises a start-up pulse signal.

* * * * *